(12) United States Patent
Cheng et al.

(10) Patent No.: US 8,063,713 B2
(45) Date of Patent: Nov. 22, 2011

(54) DIFFERENTIAL TRANSMISSION LINE HAVING A PLURALITY OF LEAKAGE RESISTORS SPACED BETWEEN THE TRANSMISSION LINE

(75) Inventors: Chung-Kuan Cheng, San Diego, CA (US); Hongyu Chen, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 712 days.

(21) Appl. No.: 11/993,833

(22) PCT Filed: Jun. 29, 2005

(86) PCT No.: PCT/US2005/023131
§ 371 (c)(1),
(2), (4) Date: Jan. 23, 2008

(87) PCT Pub. No.: WO2007/005005
PCT Pub. Date: Jan. 11, 2007

(65) Prior Publication Data
US 2010/0085132 A1   Apr. 8, 2010

(51) Int. Cl.
*H01P 3/04* (2006.01)
(52) U.S. Cl. .............................. 333/4; 333/81 A; 333/5
(58) Field of Classification Search ............ 333/4, 5, 333/12, 1, 81 A
See application file for complete search history.

(56) References Cited

U.S. PATENT DOCUMENTS

| | | | |
|---|---|---|---|
| 2,459,857 A * | 1/1949 | Watts, Jr. ................. | 333/22 R |
| 5,304,856 A * | 4/1994 | Rainal ...................... | 327/108 |
| 5,313,398 A | 5/1994 | Rohrer et al. | |
| 5,334,800 A * | 8/1994 | Kenney ..................... | 174/250 |
| 5,379,231 A | 1/1995 | Pillage et al. | |
| 5,467,291 A | 11/1995 | Fan et al. | |
| 5,517,487 A * | 5/1996 | Fridland et al. ........... | 370/200 |
| 5,694,052 A | 12/1997 | Sawai et al. | |
| 5,790,415 A | 8/1998 | Pullela et al. | |
| 5,805,030 A * | 9/1998 | Dhuey et al. .............. | 333/1 |
| 5,888,875 A | 3/1999 | Lasky | |
| 6,141,676 A | 10/2000 | Ramirez-Angulo et al. | |
| 6,308,300 B1 | 10/2001 | Bushnell et al. | |
| 6,557,148 B1 | 4/2003 | Nishida et al. | |
| 6,577,992 B1 | 6/2003 | Tcherniaev et al. | |
| 6,662,149 B1 | 12/2003 | Devgan et al. | |
| 6,665,849 B2 | 12/2003 | Meuris et al. | |
| 6,677,832 B1 * | 1/2004 | Guinn et al. ............... | 333/116 |
| 2002/0131135 A1 | 9/2002 | Chow et al. | |

(Continued)

FOREIGN PATENT DOCUMENTS
WO   WO 2007/005005   1/2007

OTHER PUBLICATIONS

Acar et al., "TETA: Transistor Level Waveform Evaluation for Timing Analysis," IEEE Trans. on Computer-Aided Design, vol. 21, No. 5, (May 2002).

(Continued)

*Primary Examiner* — Benny Lee
(74) *Attorney, Agent, or Firm* — Perkins Coie LLP

(57) ABSTRACT

Designs and techniques for transmitting electrical signals via transmission lines on integrated circuits without distortion and at the speed of light. In one implementation, one or more leakage resistors are connected between the two conductor wires of a transmission line.

19 Claims, 8 Drawing Sheets

U.S. PATENT DOCUMENTS

| | | | |
|---|---|---|---|
| 2003/0065965 | A1 | 4/2003 | Korobkov |
| 2003/0075765 | A1 | 4/2003 | Ohnakado et al. |
| 2003/0200071 | A1 | 10/2003 | Zhang et al. |
| 2003/0204828 | A1 | 10/2003 | Iwanishi |
| 2004/0008096 | A1 | 1/2004 | Liu et al. |
| 2004/0044510 | A1 | 3/2004 | Zolotov et al. |
| 2004/0196112 | A1* | 10/2004 | Welbon et al. ............ 333/1 |
| 2005/0076318 | A1 | 4/2005 | Croix et al. |
| 2005/0096888 | A1 | 5/2005 | Ismail |
| 2005/0102124 | A1 | 5/2005 | Root et al. |

OTHER PUBLICATIONS

Beattie, M., et al., "IC Analyses Including Extracted Inductance Models" Proceedings of the 36$^{th}$ ACM/IEEE conference on Design automation. Jun. 21-25, 1999, pp. 915-920 (6 pages). New Orleans, LA, USA.

Blaauw, D., et al., "Design and Analysis of Power Distribution Networks," Design of high-performance microprocessor circuits, Chapter 24, pp. 499-521, IEEE Press 2001 by the Institute of Electrical and Electronics Engineers, Inc., 3 Park Avenue, 17$^{th}$ Floor, New York, NY, USA.

Black, J.R., "Electromigration Failure Modes in Aluminum Metalization for Semiconductor Devices," Proc. IEEE, pp. 1587-1594, (2003).

Bobba et al., "IC power distribution challenges," IEEE/ACM International Conference on Computer Aided Design, pp. 643-650, (2001).

Brandt, A., "Multi-level adaptive solutions to boundary value problems," Math. Comput., 31:333-390 (1977).

Cao et al., "HiPRIME: Hierarchical and Passivity Reserved Interconnect Macromodeling Engine for RLKC Power Delivery," IEEE/ACM Design Automation Conference, pp. 379-384, (2002).

Chen, H., et al., "Interconnect and circuit modeling techniques for full-chip power supply noise analysis," IEEE Transactions on Components, Packaging, and Manufactured Technology, Part B, vol. 21, No. 3, pp. 209-215, Aug. 1998.

Chen, H., et al., "Surfliner: a distortionless electrical signaling scheme for speed of light on-chip communications," Proceedings of the 2005 International Conference on Computer Design (ICCD '05), 6 pages, (2005).

Chen, T., et al., "Efficient Large-Scale Power Grid Analysis Based on Preconditioned Krylov-Subspace Iterative Methods," Proc. 38$^{th}$ Design Automation Conf. (IEEE Cat. No. 01CH37232), ACM, New York, NY, USA, pp. 559-562, Jun. 2001.

Dally, W., "More about Wires Lossy Wires, Multi-Drop Buses, and Balanced Lines," EE273 Lecture 3 (10 pages). Sep. 30, 1998, Computer Systems Laboratory, Stanford University.

De Geus, A.J., "SPECS: simulation program for electronic circuits and systems." in Proceedings of the International Symposium on Circuits and Systems, pp. 534-537, May 7-10, 1984. Queen Elizabeth Hotel, Montreal, Canada.

Devgan, A., et al, "How to Efficiently Capture On-Chip Inductance Effect: Introducing a New Circuit Element K," Proc. ICCAD 2000, pp. 150-155 (Nov. 2000).

Devgan, A., et al., "Adaptively Controlled Explicit Simulation." IEEE Transactions on Computer-Aided Design of ICs and Systems, vol. CAD-13(6), pp. 746-762, Jun. 1994.

Feldmann, P., et al., "Reduced-order modeling of large linear subcircuits via a block Lanczos algorithm," Proceedings of 32$^{nd}$ DAC, pp. 474-479, 1995. San Francisco, California. ISBN:0-89791-725-1.

Gala, K., et al., "On Chip Inductance Modeling and Analysis," pp. 63-68. Inductance Models, DAC, Jun. 2000. Los Angeles, California.

He, L., et al., "An Efficient Inductance Modeling for Onchip Interconnects," CICC, May 1999, pp. 457-460. Town and Country Hotel, San Diego, California.

International Search Report and Written Opinion dated Jun. 2, 2006, for PCT/US05/20369, international filed Jun. 8, 2005 (9 pages).

Katopis, G.A., "Delta-I Noise Specification for a High-performance Computing Machine," Proc. of the IEEE, vol. 73, pp. 1450-1415, (1985). [Meditech, "Correction to: Katopis, G.A., 'Delta-I Noise Specification for a High-performance Computing Machine,' Proc. of the IEEE, vol. 73, pp. 1450-1415, (1985)," Proceedings of the IEEE 70(12): 1864 (Dec. 1985) attached following Katopis article].

Kerns, K.J., et al, "Stable and efficient reduction of substrate model networks using congruence transforms," Proceedings of ICCAD, pp. 207-214, 1995. San Jose, California.

Kozhaya et al., "A multigrid-like technique for power grid analysis," IEEE Transactions on Computer-Aided Design of Integrated Circuits, vol. 21, Issue 10, pp. 1148-1160, Oct. 2002.

Kozhaya et al., "Multigrid-like technique for power grid analysis," IEEE/ACM International Conference on Computer Aided Design, 2001, pp. 480-487. Nov. 4-8, 2001. San Jose, California.

La Scala et al., "A relaxation type multigrid parallel algorithm for power system transient stability analysis," IEEE International Symposium on Circuits and Systems, May 8-11, 1989. Portland, Oregon, vol. 3, pp. 1954-1957.

La Scala, M., et al., "Relaxation/Newton methods for concurrent time step solution of differential-algebraic equations in power system dynamic simulations," IEEE Transactions on Circuits and Systems 1: Fundamental Theory and Applications, vol. 40, Issue 5, pp. 317-330, (May 1993).

Lahaye, D., et al., "Algebraic Multigrid for Complex Symmetric Systems," IEEE Transactions on Magnetics, 36(4): 1535-1538, Jul. 2000. Published by IEEE Service Center, New York, NY, USA.

Lee, Y., et al., "Power Grid Transient Simulation in Linear Time Based on Transmission-Line-Modeling Alternating-Direction-Implicit Method," IEEE/ACM International Conference on Computer Aided Design, pp. 75-80, (2001).

Lee, Y.M., et al., "The power grid transient simulation in linear time on 3D alternating-direction-implicit method," Proceedings of the Design, Automation and Test in Europe Conference and Exhibition. pp. 1020-1025, (2003).

Lelarasmee, E., et al., "The Waveform relaxation method for the time-domain analysis of large scale integrated circuits." IEEE Transactions on Computer-Aided Design of ICs and Systems, vol. CAD-1(3), pp. 131-145, Jul. 1982.

Li, Z., et al., "SILCA: Fast-Yet-Accurate Time-Domain Simulation of VLSI Circuits with Strong Parasitic Coupling Effects," pp. 793-799, ICCAD 2003. San Jose, California.

Lin, S., "Stepwise equivalent conductance of circuit simulation." IEEE Transactions on Computer-Aided Design of ICs and Systems, vol. CAD-12(5), pp. 672-683, May 1993.

Lin, S., et al., "Challenges in Power-Ground Integrity," IEEE/ACM International Conference on Computer Aided Design, pp. 651-654, (2001).

Lin, S., et al., "Transient simulation of lossy interconnects based on the recursive convolution formulation," IEEE Transactions on CAS I: Fundamental Theory and Applications, vol. 39, pp. 879-892. Nov. 1992.

Namiki, T., et al., "New FDTD algorithm free from the CFL condition restraint for a 2D-TE wave," IEEE Antennas Progagat. Symp. Dig., pp. 192-195, (Jul. 1999).

Nassif, S.R., "Fast Power Grid Simulation," IEEE/ACM Design Automation Conference, pp. 156-161, (2000).

Nassif, S.R., et al., "Multigrid methods for power grid simulation," The 2000 IEEE International Symposium on Circuits and Systems, 2000. May 28-31, 2000. Geneva, Switzerland, vol. 5, pp. 457-460 (2000).

Newton, A.R., et al., "Relaxation based electrical simulation." IEEE Transaction on Computer-Aided Designs of ICs and Systems, vol. CAD-3(4), pp. 30-330. Oct. 1984.

Odabasioglu, A., et al., "PRIMA: Passive Reduced-Order Interconnect Macromodeling Algorithm," Proc. ACM/IEEE ICCAD Nov. 1997, pp. 58-65. San Jose, California.

Phillips, J.R., et al., "Guaranteed passive balancing transformations for model order reduction," Proceedings of 39$^{th}$ DAC, pp. 52-57, 2002.

Raghavan, V., et al., "AWESpice: A general tool for the accurate and efficient simulation of interconnect problems," Proceedings of the 29$^{th}$ ACM/IEEE conference on Design Automation, pp. 87-92, Jun. 8-12, 1992. Anaheim, California.

Sakallah, K.A., et al., "SAMSON2: an event driven VLSI circuit simulator." IEEE Transactions on Computer-Aided Design of ICs and Systems, vol. 4(4), pp. 668-684. Oct. 1985.

Stuben, K., "A review of algebraic multigrid," Journal of Computational and Applied Mathematics, vol. 128 (No. 1-2), pp. 281-309 (Mar. 1, 2001). Published in Netherlands.

Stuben, K., "Algebraic Multigrid (AMG): An Introduction with Applications," GMD Report No. 70 (Nov. 1999), 127 pages.

Taylor, S., "The Challenge of Designing Global Signals in UDSM CMOS," IEEE Custom Integrated Circuits Conference, San Diego, CA, pp. 429-435, (1999).

Visweswariah, C., et al., "Piecewise Approximate Circuit Simulation." IEEE Transactions on Computer-Aided Design of ICs and Systems, vol. CAD-10(7), pp. 861-870, Jul. 1991.

Wachspress, et al., "An alternating-direction implicit iteration technique," J. Soc. Ind. and Appl. Match 8: 403-424 (1960).

Wang, K., et al, "Power/ground mesh area optimization using multigrid-based techniques [IC design]," Design, Automation and Test in Europe Conferences and Exhibition, 2003, Santa Barbara, CA, pp. 850-855 (Mar. 3-7, 2003).

White, J., et al., "RELAX2: a new waveform relaxation approach for the analysis of LSI MOS circuits." in Proceedings of the International Symposium on Circuits and Systems (ISCAS), pp. 756-759, vol. 2. May 1983. Newport Beach, California.

Zhao et al., "Frequency domain analysis of switching noise on power supply network," IEEE/ACM International Conference on Computer Aided Design, pp. 487-492, (2000).

Zhao et al., "Hierarchical analysis of power distribution networks," IEEE Transactions on Computer-Aided Design of Integrated Circuits and Systems, vol. 21, No. 2, pp. 159-168, (Feb. 2002).

Zheng et al., "Toward the development of a three-dimensional unconditionally stable finite-difference time domain method," IEEE Tran. Microwave Theory and Techniques, vol. 48, No. 9, (9 pages). Sep. 2000.

Zhu, et al., "Efficient Transient Simulation for Transistor-Level Analysis," EDA Technofair Design Automation Conference Asia and South Pacific Proceedings of the 2005 Conference on Asia South Pacific Design Automation, Shanghai, China (2005) pp. 240-243, published by the ACM, New York, NY, USA.

Zhu, Z., et al., "Power Network Analysis Using an Adaptive Algebraic Multigrid Approach," ACM/IEEE Design Automation Conference, pp. 105-108, Jun. 2-6, 2003. Anaheim, California.

Afshari, E. and A. Hajimiri, "Non-Linear Transmission Lines for Pulse Shaping in Silicon," Proc. of IEEE Custom Integrated Circuits Conference, pp. 91-94, Sep. 2003.

Backhouse et al., "WSi$_x$ Thin Film for Resistors," Thin Solid Films, vol. 311, No. 1-2, pp. 299-303 (1997).

Beckmann, B.M. and D.A. Wood, "TLC: Transmission Line Caches," Proceedings of the 36$^{th}$ IEEE International Symposium on Microarchitecture (MICRO-36'03), 12 pages (2003).

Chang et al., "Near Speed-of-Light Signaling Over On-Chip Electrical Interconnects," IEEE Journal of Solid-State Circuits, vol. 38, No. 5, pp. 834-838 (2003).

Chang et al., "RF/Wireless Interconnect for Inter- and Intra-Chip Communications," Proceedings of the IEEE, vol. 89, No. 4, pp. 456-466 (2001).

Chen, H. et al. Surfliner: a distortionless electrical signaling scheme for speed of light on-chip communications, Proceedings of the 2005 International Conference on Computer Design (ICCD'05), 6 pages, (2005).

Dally et al., "High-Performance Electrical Signaling," IEEE Integrated Conference on Massively Parallel Processing Using Optical Interconnections, 6 pages, Jun, 1998.

Ho et al., "The Future of Wires," Proc. of IEEE. vol. 89, No. 4, pp. 490-504 (Apr. 2001).

Ho, R. et al., "Efficient On-Chip Global Interconnectors," 2003 Symposium on VLSI Circuits Digest of Technical Papers, pp. 271-274, Jun. 2003.

Jokerst et al., "The Heterogeneous Integration of Optical Interconnection Into Integrated Microsystems," IEEE Journal of Selected Topics in Quantum Electronics, vol. 9, No. 2,, pp. 350-360 (Mar./Apr. 2003).

Krauter, B. and L.T. Pileggi, "Generating Sparse Partial Inductance Matrices with Guaranteed Stability," Proceedings of the 1995 IEEE/ACM international conference on Computer-aided design, San Jose, California, pp. 45-52 (1995).

Kuhn et al., "Integration of Mixed-Signal Elements into a High-Performance Digital CMOS Process," Intel Technology Journal vol. 6, Iss.. 2, pp. 31-42 (May 16, 2002).

Maheshwari A. and W. Burleson, "Differential Current-Sensing for on Chip Interconnects," IEEE Transactions on Very Large Scale Integration (VLSI) Systems, vol. 12, No. 12, pp. 1321-1329 (Dec. 2004).

Stojanovic, V. et al., "Adaptive Equalization and Data Recovery in a Dual Mode (PAM2/4) Serial Link Transceiver," 2004 Symposium on VLSI Circuits Digest of Technical Papers, pp. 348-351 (2004).

\* cited by examiner (a) unsilicided poly resistor (b) diffusion resistor

US 8,063,713 B2

DIFFERENTIAL TRANSMISSION LINE HAVING A PLURALITY OF LEAKAGE RESISTORS SPACED BETWEEN THE TRANSMISSION LINE

RELATED PATENT APPLICATION

This application is a national stage application of and claims the benefit of PCT/US2005/023131 filed on Jun. 29, 2005. This application is incorporated by reference as part of the specification of this application.

BACKGROUND

This application relates to differential transmission lines in circuits such as integrated circuits.

Electronic circuits use electrically conducting paths or interconnects to interconnect various circuit elements. The properties of such interconnects, especially the global interconnects, are known to have significant or even dominating impact on the circuit performance and the power consumption. Therefore, the designs and engineering of the interconnects have attracted much attention in the field of electronics, especially in integrated circuits.

In many integrated circuits, various interconnects are implemented by inverter repeated RC wires. In this design, each interconnect is basically multiple conductive wires that are interconnected by inverters. The RC responses of such interconnects cause latency in the electrical signaling and the latency increases as integrated circuits operate at increasingly higher clock frequencies. In some applications, the inverter repeated RC wires can no longer keep up with the pace of advances in transistor speed at a satisfactory cost of power consumption. See, e.g., R. Ho, K. W. Mai, and M. A. Horowitz, "The Future of Wires," Proc. of IEEE, vol. 89, No. 4, pp. 490-504 (2001).

Several interconnects for integrated circuits have been developed as alternatives to the inverter repeated RC wires, including on-chip optical interconnects and RF wireless interconnects. See, e.g., N. M. Jokerst et al., "The Heterogeneous Integration of Optical Interconnections Into Integrated Microsystems," IEEE Journal of Selected Topics in Quantum Electronics, Vol. 9, No. 2, pp. 350-360 (2003) and M. F. Chang, V. P. Roychowdhury, L. Zhang, H. Shin, and Y. Qian, "RF/Wireless Interconnect for Inter- and Intra-Chip Communications," Proceedings of the IEEE, vol. 89, no. 4, pp. 456-466 (2001).

SUMMARY OF THE INVENTION

This application describes, among others, distortionless differential transmission lines for transmitting signals at the speed of light. In one implementation, a device is described to include a first conductor and a second conductor to form a differential transmission line to transmit an electrical signal; and leakage resistors connected between the first and second conductors at different positions along the differential transmission line to make a phase velocity and a signal attenuation of the electrical signal to be independent of a frequency of the electrical signal.

In another implementation, a device includes a first conductor and a second conductor to form a differential transmission line to transmit an electrical signal; and leakage resistors connected between the first and second conductors at different positions along the differential transmission line. Each leakage resistor has a conductance per one unit length of RC/L, where R, C and L are effective resistance, capacitance and inductance of the differential transmission line per one unit length, respectively.

In yet another implementation, a method includes using at least two conductors to form a differential transmission line to guide a signal; and connecting a plurality of leakage resistors at different locations along the differential transmission line to connect the two conductors to make the phase velocity and attenuation of the signal in the transmission line independent of a frequency of the signal.

These and other implementations and their applications are described in greater detail in the attached drawings, the following detailed description, and the claims.

DETAILED DESCRIPTION OF THE INVENTION

Electrical signaling over on-chip transmission lines is one of the most attractive solutions for high performance on-chip communications. See, e.g., B. M. Beckmann, and D. A. Wood, "TLC: Transmission Line Caches," 36th IEEE International Symposium on Microarchitecture (2003). Comparing with traditional inverter repeated RC wires, the transmission line has a number of advantages. For example, the signal propagates at the speed of light on a transmission line. The transmission line can be used to achieve higher throughput at lower latency. For another example, the transmission line signaling has much smaller power consumption than the repeated RC wires because the forced swing of wire capacitance in the repeated RC wires is eliminated in the transmission line.

One challenge to the implementation of transmission line for on-chip communication is the resistive nature of the impedance of on-chip metal wires. The high resistance causes significant frequency dependency on both the wave propagation speed and attenuation. For random binary bits input, the spectrum of input waveform spans over a large spectral range. Within this spectral range, the phase velocity and attenuation of the signals varies significantly as the frequency changes. See, e.g., R. T. Chang, N. Talwalkar, C. P. Yue, and S. S. Wong, "Near Speed-of-Light Signaling Over On-Chip Electrical Interconnects", IEEE Journal of Solid-State Circuits, vol. 38, No. 5, pp. 834-838 (2003). This feature causes the wave form to exhibit excessive dispersion through the process of wave propagation. One of the consequences of this dispersion is the inter symbol interferences (ISI) which in turn lead to significant data dependant jitters and limit the throughput of the communications.

The differential transmission lines of this application may be used to provide on-chip electrical signaling in various integrated circuits to preserve the original wave form of a signal and to transmit the signal at the speed of light, independent of its frequency. Specific examples are described below for implementations of a differential transmission line with spatially distributed leakage conductance along the transmission line via leakage resistors connected between two conductor wires of each differential pair in the transmission line. The leakage resistors between the wires of a differential pair are intentionally inserted into the transmission line. The resistance value of each leakage resistor is set to achieve a transmission speed for all frequency components of a signal at the speed of light in the dielectric material surrounding the transmission line and to achieve a "distortionless" transmission by minimizing the signal dispersion, i.e., distortions between different signal components at different signal frequencies in the signal.

Figure 1A:
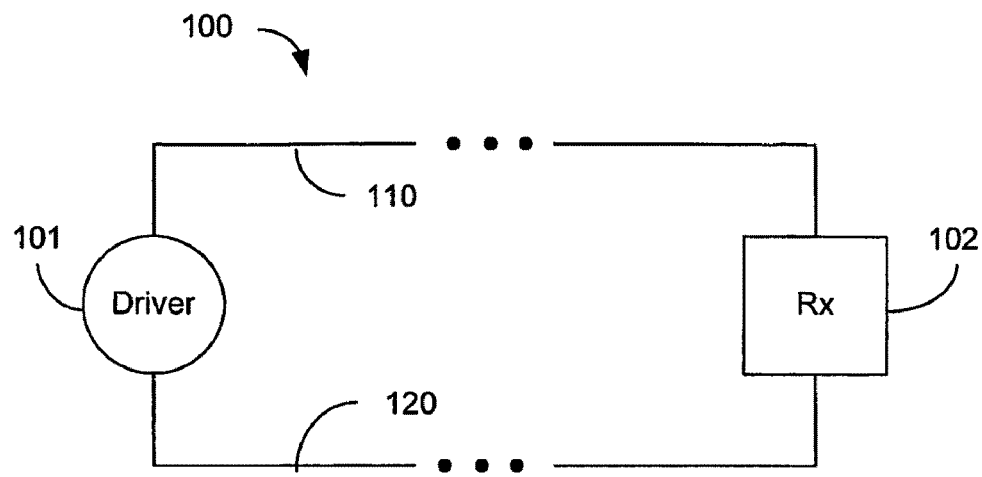
FIGS. 1A and 1B show an example of a lossy differential transmission line.
Figure 1B:
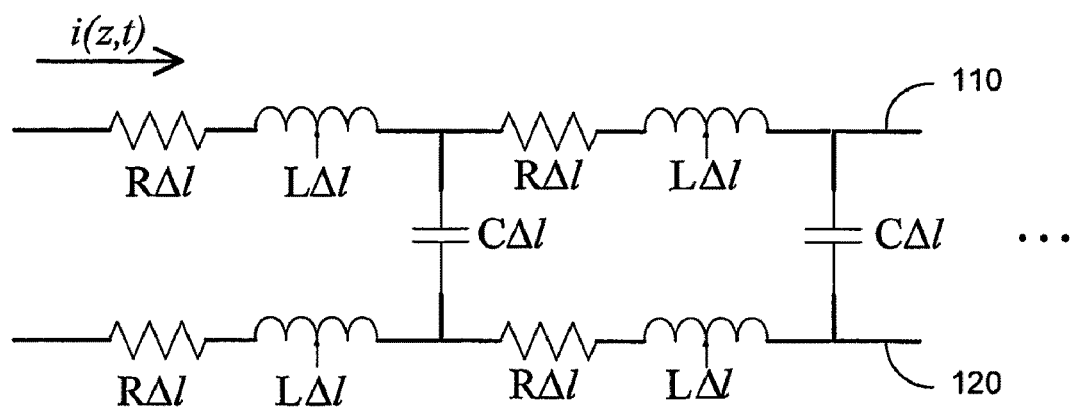

FIG. 1A shows an example of a differential transmission line 100 having a pair of conductors or conductor wires 110 and 120 to connect a signal driver 101 at one end and a signal receiver (Rx) 102 at the other end. The two conductors 110 and 120 are separated and electrically insulated from each other everywhere except at the driver 101 and the receiver 102. The signal driver 101 has two terminals that are respectively connected to the two conductors 110 and 120. A signal (i(z, t)), as shown in FIG. 1B, from the signal driver 101 is applied in form of two differential voltages on the two conductors 110 and 120, respectively. The signal propagates through the two conductors 110 and 120 to reach the receiver 102.

The differential transmission line 100 has resistance (RΔl) and inductance (LΔl) in each conductor. In actual circuits, shunt capacitance (CΔl) exists between two conductors 110 and 120. These parameters of the transmission line 100 can be represented by R, C and L as the effective resistance, capacitance and inductance of the differential transmission line per one unit length, respectively. Accordingly, there is loss of the electrical current through the shunt capacitance between the two conductors 110 and 120. FIG. 1B shows an equivalent circuit of the transmission line with two conductors 110 and 120 in FIG. 1A to show the resistance (RΔl), the inductance (LΔl) and the shunt capacitance (CΔl). Such a transmission line exhibits dispersion and the phase velocity of the signal and the attenuation of the signal both vary with the signal frequency. Hence, different signal components at different frequencies have different phase velocities and experience different attenuations when propagating along the transmission line. An electronic pulse has multiple spectral components at different frequencies and as such will be distorted after propagation through this transmission line 100. Therefore, the signal is distorted at the receiver 102.

Figure 2A:
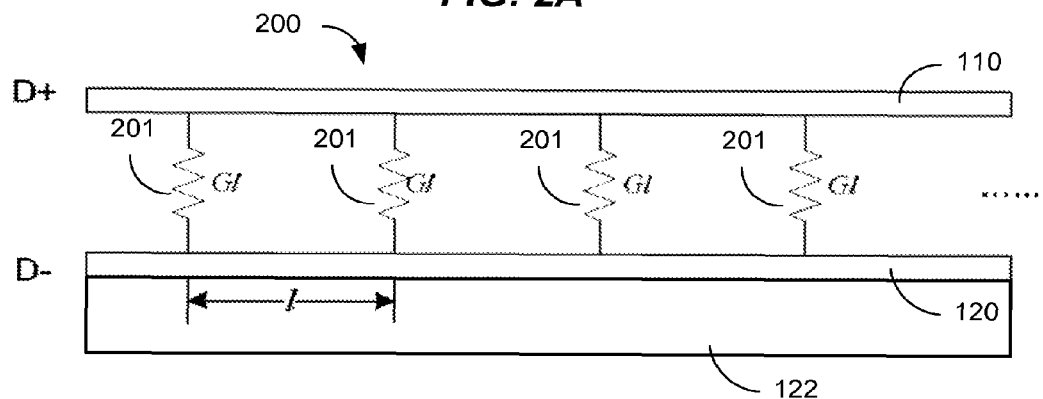
FIGS. 2A, 2B and 2C show an example of a distortionless differential transmission line having leakage resistors connected along the transmission line to provide leakage conductance between the two conductors that form the transmission line.
Figure 2B:
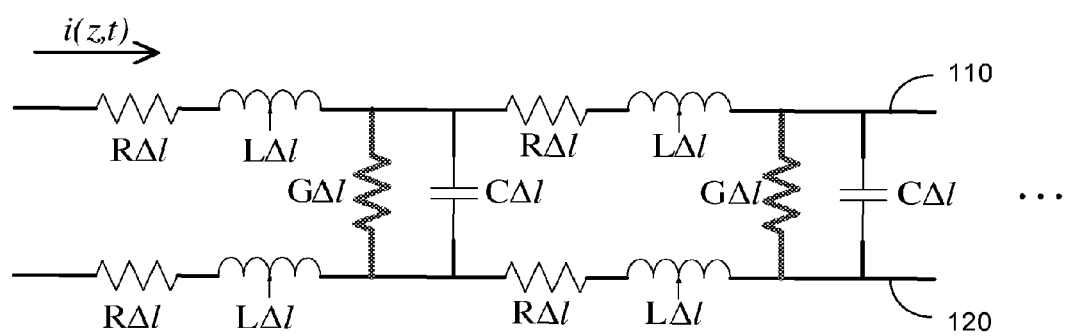
Figure 2C:
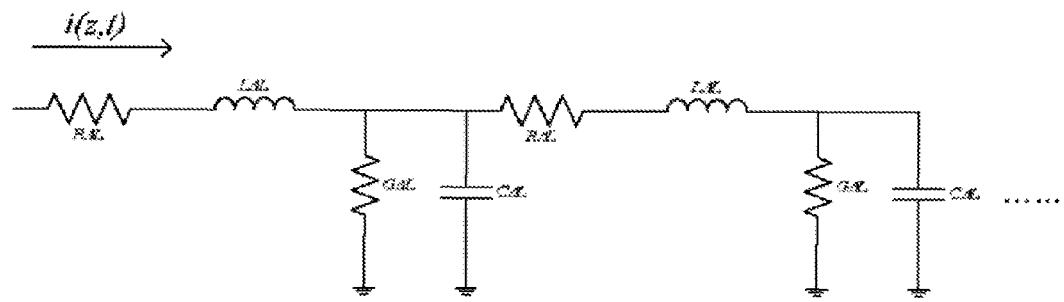

FIGS. 2A, 2B and 2C illustrate one example of the distortionless transmission line 200 with intentionally inserted leakage resistors 201 between the two conductors 110 (D+) and 120 (D−) along the transmission line to eliminate or minimize the dispersion and thus the signal distortion as shown in FIG. 2A. FIG. 2A shows the structure of a portion of the transmission line 200. In this particular example, the two conductors 110 and 120 are parallel to each other. In many implementations on chips, the two conductors 110 and 120 are parallel to the substrate 122. Each leakage resistor 201 is connected between the two connectors 110 and 120. Multiple leakage resistors 201 are connected along the transmission line 200. In the specific examples described here, the leakage resistors 201 may be equal in resistance (RΔl) and evenly spaced along the transmission line with a spacing 1 between two adjacent leakage resistors 201. Each leakage resistor has a corresponding leakage conductance Gl. In some implementations, a leakage resistor (e.g., a leakage resistor 201) can be implemented using a resistive metal resistor.

FIGS. 2B & 2C show an equivalent circuit of the transmission line 200 (FIG. 2A) to illustrate the resistance (RΔl), the inductance (LΔl), the shunt capacitance (CΔl) and the inserted leakage resistance (by associated leakage conductance (GΔl)). FIG. 2C also shows an equivalent discrete RLGC circuit model for analysis of the transmission line 200 (FIG. 2A). Each leakage resistor is represented by the corresponding leakage conductance G per one unit length (GΔl). It is assumed that R, L, G, C are frequency-dependant constants. The jitter caused by the frequency dependency of R, L, G, C is not significant for on-chip interconnect applications. In FIGS. 2B and 2C, i(z,t) indicate time and distance dependent electrical current along the transmission line 200.

The signal wave in the transmission line 200 is described as the function of distance z along the transmission line, and time t, by the Telegrapher's equations:

$$\frac{dV(z,t)}{dz} = -RI(z,t) - L\frac{dI(z,t)}{dt} \quad (1)$$

$$\frac{dI(z,t)}{dz} = -C\frac{dV(z,t)}{dt} \quad (2)$$

wherein,
R=distributed wire resistance of the conductors along the transmission line
L=distributed wire inductance along the transmission line
I=wire current along the transmission line
C=wire capacitance along the transmission line
V=wire voltage along the transmission line For a sinusoidal signal of angular frequency w, the propagation of the incident wave along the transmission line 200 can be expressed as:

$$V(z,t) = V_0 e^{-\alpha z - j\beta z + j\omega t} \quad (3)$$

where α and β are respectively the real and imaginary parts of the propagation function γ which is defined as:

$$\gamma = \sqrt{(R+j\omega L)(G+j\omega C)} = \alpha + j\beta. \quad (4)$$

Equation (3) shows that the exponential, $e^{-\alpha}$, of the real part of the propagation function represents the unit distance attenuation of the transmission line. The imaginary part β of the propagation function γ corresponds to the phase shift of the wave along the transmission line 200. The phase velocity of the incident wave is $\upsilon = \omega/\beta$.

The following expressions of α and β can be derived from Equation (4):

$$\alpha = \sqrt{\frac{1}{2}\sqrt{RG - \omega^2 LC + \sqrt{(RG - \omega^2 LC)^2 + \omega^2(LG + RC)^2}}} \quad (5)$$

$$\beta = \sqrt{\frac{1}{2}\sqrt{\omega^2 LC - RG + \sqrt{(RG - \omega^2 LC)^2 + \omega^2(LG + RC)^2}}} \quad (6)$$

Equations (5) and (6) show that, when there is no leakage conductance (G=0), which is the common practice in the on-chip transmission line because silicon dioxide is a very good insulator, the attenuation ($\alpha$) and phase velocity ($\upsilon=\omega/\beta$) depend on the frequency $\omega$, especially when the wire resistance, R, is comparable to or larger than the impedance contributed by wire inductance, $\omega L$.

Notably, when the leakage conductance of each leakage resistor is set at G=RC/L, the attenuation and the phase velocity are independent of the signal frequency based on Equations (5) and (6). Under this condition, different signal spectral components travel at the same speed (the speed of light) and experience the same attenuation when propagating in the transmission line 200. The signal, therefore, is not distorted. In this context, the transmission line 200 provides a distortionless transmission.

Under the condition of G=RC/L, the parameters $\alpha$ and $\beta$ can be expressed as follows:

$$\alpha = R\sqrt{L/C} \quad (7)$$

$$\beta = \omega\sqrt{LC} \quad (8)$$

Accordingly, the characteristic impedance $Z_0$, the phase velocity $\upsilon$ and the attenuation A(z) of the transmission line 200 can be respectively written in the following equations:

$$Z_0 = \sqrt{\frac{L}{C}} \quad (9)$$

$$\upsilon = \frac{1}{\sqrt{LC}} = c \quad (10)$$

$$A(z) = e^{-\frac{R}{Z_0}z} \quad (11)$$

The distortionless transmission line has pure resistive characteristic impedance as in Equation (8). The phase velocity is exactly the speed of light c in the dielectrics as expressed in Equation (10). According to Equation (11), the attenuation A(z) depends on the ratio between wire resistance R and characteristic impedance $Z_0$. For typical on-chip transmission line implemented on the upper low impedance metal layers, the resistance of a wire with a width of several microns can be less than 10 ohm/mm, and the characteristic impedance of transmission line may be around 100 ohm. Thus, an input signal with magnitude of 1.0V may have a magnitude of 135 mV after traveling a distance of 2 cm. A sense amplifier may be used to detect the output signal at this magnitude. A. Maheshwari and W. Burleson described examples of sense amplifiers in their article "Differential Current-Sensing for On Chip Interconnects," IEEE Transactions on VLSI, Vol. 12, No. 12, pp. 1321-1329 (2004).

In various implementations, e.g., on-chip wires, the leakage resistors or conductors can be inserted between two wires or conductors of a differential pair to realize the constant leakage conductance G of RC/L per unit length for the transmission line. In some implementations, equal valued resistors can be connected between the two conductors and spaced evenly from one another along the transmission line. The spacing l between two adjacent leakage resistors can be a constant for all leakage resistors 201, i.e., a leakage conductor with conductance Gl is periodically insert at every distance l in the z direction along the transmission line. When the interval l is small enough comparing with the wavelength of the data signal, the discontinuity caused by this discrete resistor insertion scheme is ignorable. Simulation results suggest that, when l is equal to or less than $ct_p/20$, the jitter caused by ISI is smaller than 5% of the clock period, where $t_p$ is a clock period of the signal and c is a speed of light in a dielectric material surrounding the transmission line. In general, the jitter decreases with the interval l. When the interval l increases, the jitter increases. The actual interval l between two adjacent leakage resistors for a specific implementation of the differential transmission line 200 in FIG. 2A can be selected according to the acceptable jitter for the implementation.

Other configurations for implementing the constant leakage conductance G of RC/L per unit length for the transmission line are also possible. For example, different leakage resistors placed along the transmission line may have different conductance or resistance values from one another as long as the effective leakage conductance per unit length is RC/L. As another example, the leakage resistors may not be evenly spaced along the transmission line and the spacings may vary. The constraint is that the product of the interval length and the leakage resistance is a constant given by L/RC.

Figure 3:
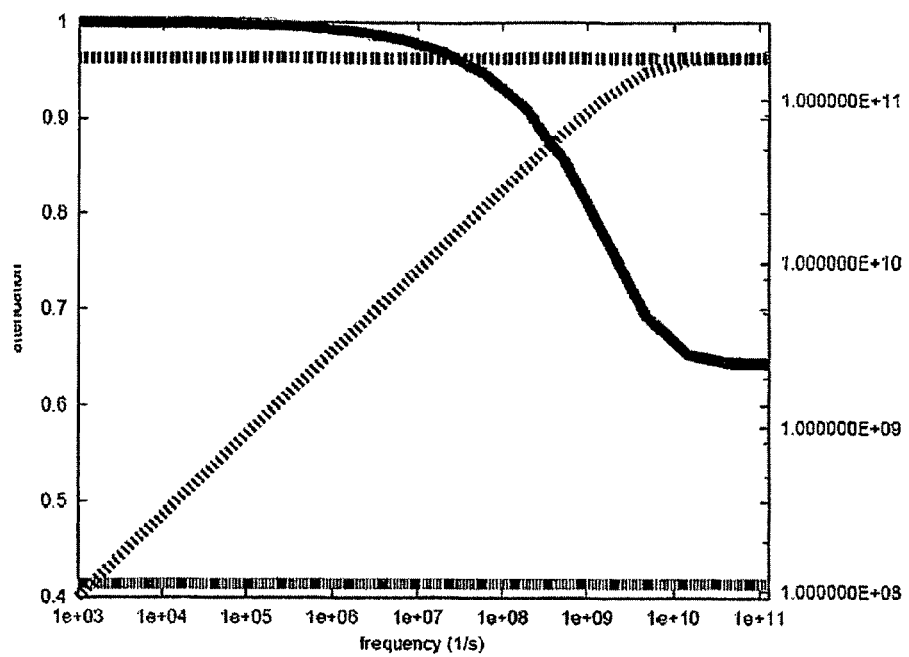
FIGS. 3 and 4 show simulated transmission properties of the transmission lines with and without the leakage resistors.

FIG. 3 illustrates the characteristics of a differential pair of 2 cm-length and 4-μm width wires. Significant changes in the attenuation and phase velocity are present. When the leakage or shunt conductance is zero (G=0), the attenuation ranges from 0.9997 at 1 KHz to 0.644 at 1 GHz. The speed or phase velocity ranges from $9.0 \times 10^7$ mm/s at 1 KHz to $8.5 \times 10^{10}$ mm/s at 1 GHz. The curve saturates at the speed of light $1.8 \times 10^{11}$ mm/s when the frequency is about 1 T Hz. For the proposed distortionless pairs, the attenuation is 0.4147 and the phase velocity is at the speed of light. These two curves are flat.

Figure 4:
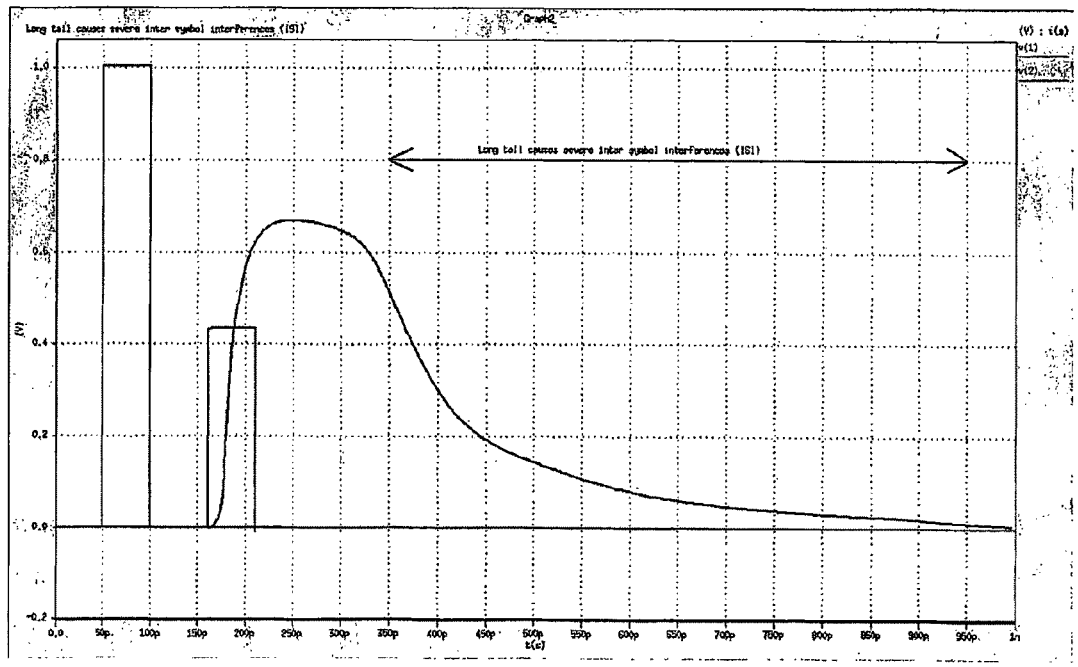

FIG. 4 shows the dispersion effects on a square pulse wave that propagates through a differential transmission line without the leakage resistors shown in FIG. 2 (G=0) and a similar differential transmission line with the leakage resistors shown in FIG. 2 (G=RC/L). The input is the square wave at left, which rises at 50 ps. When shunt conductance G=0, the output disperses on the rising and falling edges. A long tail appears at the falling edge of the pulse due to the is dispersion and is the main cause of the intersymbol interference. Because the digital signals include signal components at different frequencies, the distortion causes interferences among adjacent symbols. The intersymbol interference is one limiting factor of the performance of the transmission lines.

When the leakage resistors are present and set at G=RC/L, the transmission line behaves differently. As illustrated in FIG. 4, the pulse wave form is preserved after the propagation. The magnitude of the signal, however, drops. The rising edge starts at 161 ps the same rising time as the wires with no shunts. However, the output pulse substantially maintains the original square waveform without significant distortions. The delay is 161−50=111 ps, and is the time for the signal to travel at the speed of light, which is about $1.8 \times 10^{11}$ mm/s for a length of 2 cm along the transmission line.

The performance of the distortionless transmission line 200 is relatively insensitive to deviations of the values of the leakage resistors 201 from the optimized value of G=RC/L. For example, the leakage resistors 201 may not have the same resistance and the value of each leakage resistor may be different from the ideal conductance value of G=RC/L. Various factors may cause such deviations, such as variations in the fabrication process and variations in the voltage and the temperature at different locations of the transmission line. Assume that the leakage conductance G of a leakage resistor varies from the perfectly matched or optimized conductance value RC/L by a factor $\Delta$, i.e. G=(1+$\Delta$)RC/L. Under the approximation with the first order Taylor's expansion, the frequency dependency of the attenuation and phase velocity can be expressed as:

$$\alpha = \frac{R}{\sqrt{L/C}}\left(1 + \frac{1}{2}\Delta - \frac{1}{8}\frac{R^2}{R^2 + \omega^2 L^2}\Delta^2\right), \quad (12)$$

$$v = \frac{1}{\sqrt{LC}}\left(1 - \frac{1}{8}\frac{R^2}{R^2 + \omega^2 L^2}\Delta^2\right).$$

In Equation (12), the frequency dependent terms of the attenuation and phase velocity occur not at the first order but rather at the second order of the frequency. Hence, the attenuation and the phase velocity are relatively insensitive to variations in frequency. The attenuation constant has a first order term independent of the frequency and this first order term does not contribute to the distortion. For the phase velocity, the first order term is zero. Therefore, the shunt conductance G=RC/L is a solution to minimize the skew sensitivity. Applying a similar procedure, for the given shunt conductance G=RC/L, the serial resistance R is a solution to minimize the skew sensitivity.

The coefficients of the second order terms in Equation (12) are limited by an upper bound factor of ⅛. Suppose that the shunt conductance changes by ten percent, i.e. $\Delta=0.1$. The third order terms in Equation (12) deviate by no more than $\Delta^2/8 \approx 0.0012$. Therefore, the distortionless wires can distribution multi-gigahertz clock within comfortable design space. This tolerance of the transmission line 200 to variations is one of the advantages of the present design.

Figure 5:
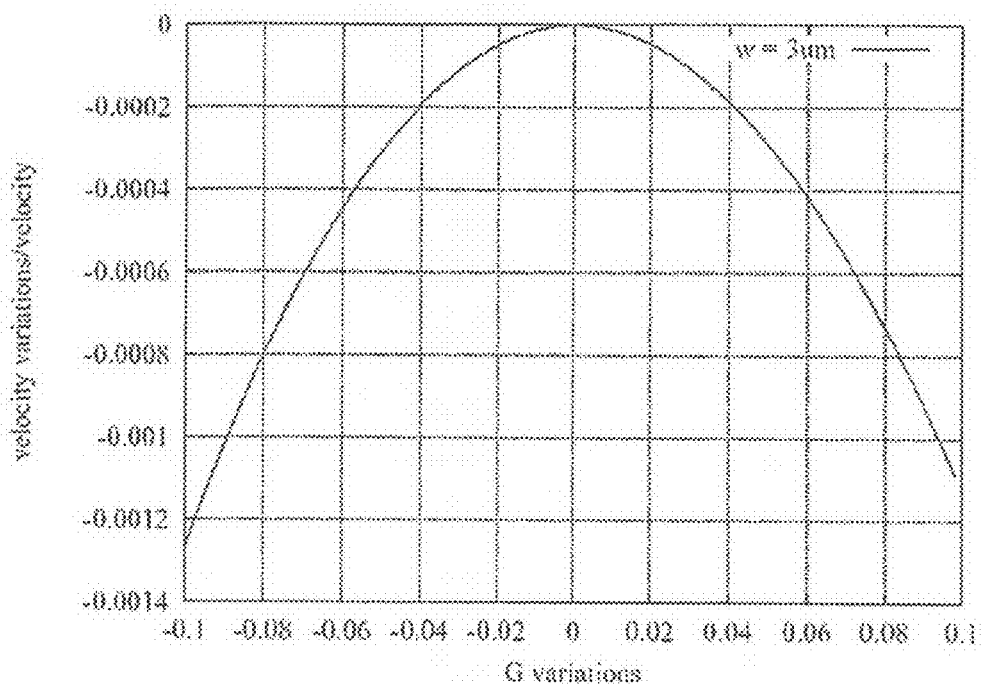
FIG. 5 shows simulated tolerance properties of the transmission lines with the leakage resistors in presence of variations from the optimized values, where the horizontal axis is in a percentage of a change in G from the optimized value.

FIG. 5 shows variations in the phase velocity when G varies from its designed value of RC/L by up to 10% for a 3 um wide on-chip wire when the frequency changes from 10 MHz to 10 GHz. Hence, when G stays at its nominal value, i.e. variation equals to 0, the changes of phase velocity and attenuation between 10 MHz and 10 GHz are all 0. When G has a 10% variation, there is less than 1% change in the speed and less than 5% variations in the signal amplitude. This tolerance of the transmission line 200 to variations is one of the advantages of the present design A high-speed distortionless transmission line based on the design in FIG. 2A may be fabricated by various methods, including the various silicon processes. As an example, research results suggest that the 65-nm silicon fabrication technology can be used to construct such a distortionless transmission line integrated on a silicon chip to achieve a data rate of 15 Gbits/s over a 20-mm on-chip serial link without any equalization. The jitter caused by the communication over the 20-mm transmission line is lower than 10 ps. The average power consumption of the data transportation through the 20-mm transmission line can be as low as 3.1 pJ/bit. The wiring channel requires less than an area of 1000 mu.m.sup.2 on poly for a 20-mm long serial link. In some implementations, the use of this distortionless transmission line may reduce the transmission delay by six times and reduce the power consumption by 85% in comparison with electrical signaling via a conventional repeated RC wire.

Implementations of the present transmission line approach may be configured to achieve one or more advantages over other on-chip signaling schemes. One advantage, for example, is that the signal propagation on the distortionless transmission line is exactly the speed of light. This property is attractive for the connections with extreme requirement on the signal latency, such as the global control signal in a large processor or the global data communication in a large network-on-chip. Also, the waveform essentially remains undistorted at the receiver end after propagation through the transmission line and there is no inter symbol interference. As a result, the transmission produces extremely low jitter. This property enables high bandwidth communications. Because the signal in the present transmission line does not take a full swing on the entire wire and no buffer is inserted, the power consumption is much less than the RC wires with repeaters. In addition, the present transmission line can be implemented by using simple sender and receiver circuits to simplify the over structure and the fabrication. As a further example of the advantages, there are no active components between the sender and the receiver in the present transmission line so that the system tends to be robust against process, voltage and temperature variations.

Figure 6:
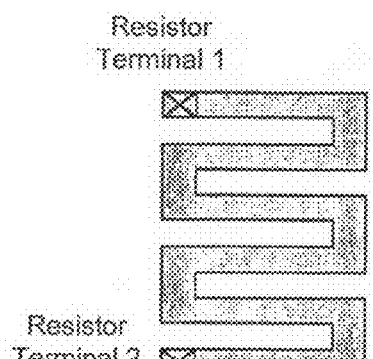
FIGS. 6(a) and (b) show two exemplars for the leakage resistors in FIG. 2A.
Figure 6:
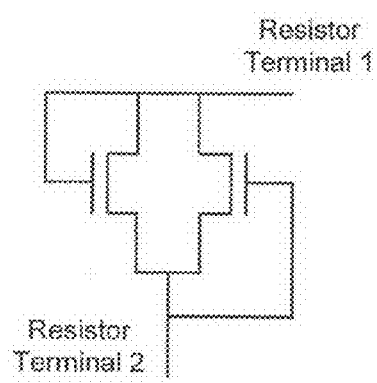

Referring back to FIG. 2A, the leakage resistors 201 may be implemented in various configurations. In one example, a leakage resistor 201 can be a poly resistor as shown in the insert (a) in FIG. 6. Various structures and fabrication processes for poly resistors and unsilicided poly resistors are known. In another example shown in the insert (b) in FIG. 6, a leakage resistor 201 may also be a diffusion resistor formed from two connected transistors. In some implementations, the unsilicided poly resistor may be preferred because it occupies less area and has a better voltage-current linearity than some diffusion resistors. The sheet resistance of an unsilicided poly resistor can be as high as 1000 ohm/square in some implementations. The resistors can have a Resistor Terminal 1 and a Resistor Terminal 2, e.g., for connection.

Other high resistive materials can also be used to construct the leakage resistors. For example, various metal resistors may be used as the leakage resistors. For another example, TaN or WSi may also be used to construct the leakage resistors. See "Integration of Mixed-Signal Elements into a High-Performance Digital CMOS Process" by K. J. Kuhn, et al. in Intel Technology Journal, vol. 6, issue 02, pp. 31-42 (2002), and "WSi Sub(X) Thin Film for Resistors" by C. J. Backhouse, et al. in THIN SOLID FILMS. Vol. 311, no. 1-2, pp. 299-303 (1997). Consider using a typical 3 µm wide copper wire at metal 6 for the differential transmission line based on the 90-nm technology. If a leakage resistor formed by a poly wire with a minimal width of e.g., 100 nm, is inserted in the differential transmission line every 200 µm, the leakage conductors for a 20-mm long link uses only 126 µm² of poly area.

For on-chip wires, the attenuation of the signal is exponentially proportional to the wire resistance. Hence, reducing the wire resistance is important to reducing the signal attenuation. A small attenuation can be used to simplify the receiver, to reduce the power consumption of the system, and improve the robustness against the crosstalk and other variations. One design to reduce the wire resistance is to use two or more pairs of differential wires to carry the same signal.

Figure 7A:
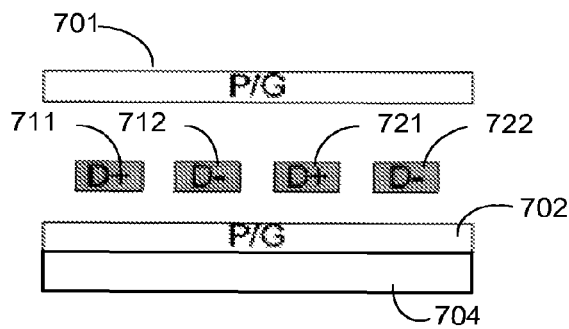
FIGS. 7A, 7B, 7C, 8A, 8B and 9 show examples of conductor arrangements for distortionless differential transmission lines with leakage resistors.

FIG. 7A shows one example where a first pair of conductor wires 711 (D+) and 712 (D−) and a second pair of conductor wires 721 (D+) and 722 (D−) are used to form a differential transmission line to carry the same signal. This design can be considered as splitting each wire in the two wires for a differential pair into two or more wires to increase the total cross section area of the transmission line. Because the wire resistance is inversely proportional to the cross section area, this splitting wire design can reduce the wire resistance. Both wires 711 and 721 are used to receive the same signal from the first output terminal of the signal driver 101 (FIG. 1) and the wires 721 and 722 are used to receive the same signal from the second output terminal of the signal driver 101. In this particular example, the wires 711, 712, 721 and 722 are in positioned in sequence from left to right in the same plane parallel to and between two conductor layers 701 and 702 as the power ground layers for the chip. The chip can include a substrate 704 on which the first and second conductor layers 701 and 702 are formed.

Figure 7B:
Figure 7C:
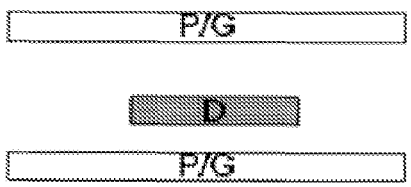
Figure 7C:
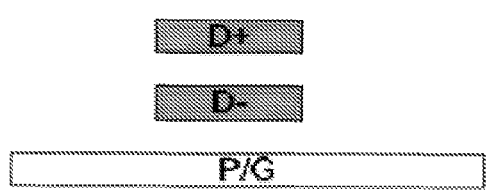

When the differential transmission line is used to transmit signals at high frequencies, e.g., in the multi-Giga hertz frequency range, the signal current in each conductor may crowd near the edge of the wires due to the skin effect. One consequence of this skin effect is the reduced effective cross section area in the conductor wire that is used by the current. Hence, simply widening the wires based on the splitting wire design in FIG. 7A may not generate the resistance reduction proportional to the routing area usage. For high-speed communications, a different split wire design as shown in FIG. 7B may be used where each wire (D− or D+) is dimensioned to have a wide side and a short side and the two wires are coupled to each other via their wide sides to reduce the skin effect. The two wires can be placed between two power/ground (P/G) conductor layers which are parallel to the wide sides of the two wires. Another design for high-speed communications is shown in FIG. 7C where a single conductor strip line (D) is placed between two power/ground (P/G) conductor layers parallel to the wide side of the single conductor in the middle to reduce the skin effect and the wire resistance.

Figure 8A:
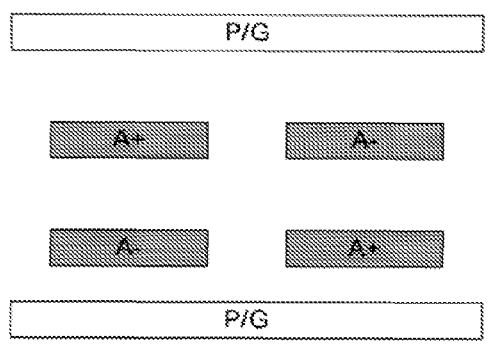
Figure 8B:
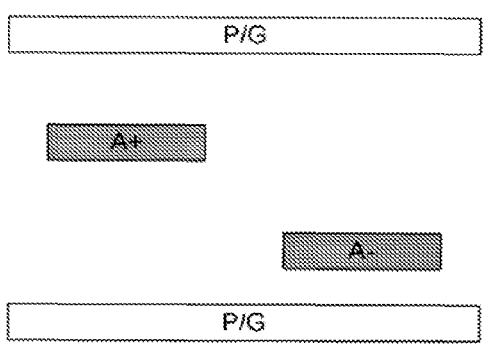

FIGS. 8A and 8B show two additional examples of differential transmission lines in split wire configurations. FIG. 8A uses two differential pairs (A+, A−) between two power/ground (P/G) conductors to form a differential transmission line but use a different spatial arrangement from the design in FIG. 7A. FIG. 8B is a variation from the design in FIG. 7B having one differential pair (A+, A−) between two power/ground (P/G) conductors.

The differential transmission lines described here are waveguides and use at least two conductors to transmit signals. Various other configurations are possible. For example, a two-conductor waveguide often being referred as "a stripline" is a special form of the differential transmission line and can be used to incorporate the present leakage resistors to for distortionless transmission. In one implementation, such a stripline may include a conductor stripline and a power or ground shield to transmit an electrical signal. The leakage resistors may be connected between the conductor stripline and shield at different positions along the transmission line to make a phase velocity and a signal attenuation of the electrical signal to be independent of a frequency of the electrical signal.

Figure 9:
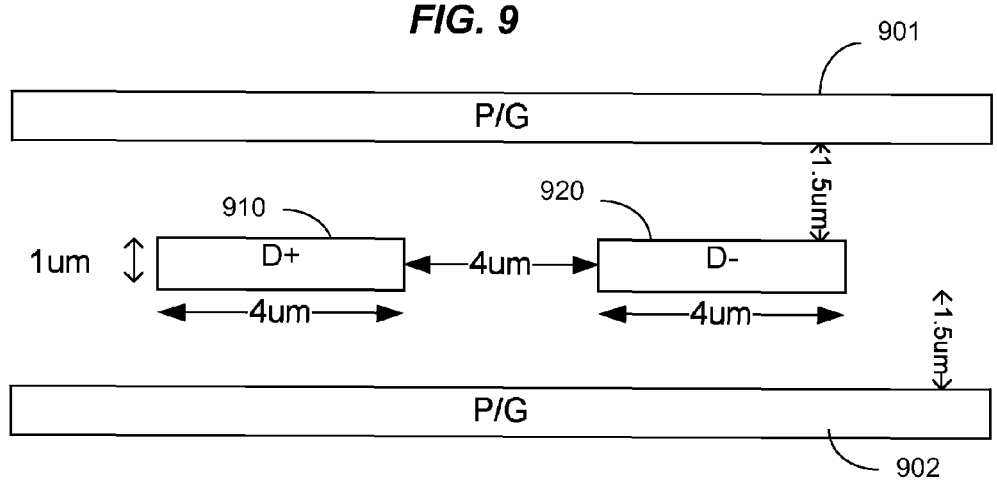

To further illustrate the operation of the present distortionless differential transmission line, FIG. 9 shows the cross section view of an exemplary design along the direction perpendicular to the transmission line. The periodically located leakage resistors are not shown. In this design, a pair of edge-coupled strip lines 910 (D+) and 920 (D−) made of copper are placed between low resistive upper and lower power/ground (P/G) metal layers 901 and 902. Each of the wires 910 and 920 is 1 .mu.m thick along the direction perpendicular to the layers 901 and 902 and has a width of 4 .mu.m along the direction parallel to the layers 901 and 902. The separation between the wires 910 and 920 is also 4 .mu.m. The wires 910 and 920 are separated from the power/ground plane layers by 1.5 .mu.m.

In the design in FIG. 9, the unit length resistance, inductance, and capacitance values, R, L, C, of wires can be obtained by using a 3-D field solver. These values are, R=4.4 Ω/mm, L=1.262 nH/mm, and C=196.418 f F/mm. The characteristic impedance of the differential pair is 84.5×2=169Ω. The number of leakage resistors (stages) inserted between the wires range from 4 to 200. For a pair of 2-cm long wires, in order to match the RLC values to achieve distortionless transmission, the total leakage conductance is $6.15 \times 10^{-4}$ S. The resistance of each leakage resistor ranges from 6.5 kΩ to 325 kΩ. Assuming a 1.0V swing level at the sender side, the signal amplitude at the receivers side is 365 mV.

For each of the wire segments, the Agilent ADS Momentum is used to extract the 4-port S-parameter description. Then, a transient analysis of the circuit is performed using the HSpice software. A total of $2^{10}-1=1023$ bits pseudo random bit sequences (PRBS) is generated as the input signal to the transmission line. The initial bit vector of PRBS is 1010101, and the generation polynomial is $x^7+x+1$. The clock frequency is set to 15 GHz, and each of the rising and falling transitions uses 10% of the clock cycle.

Simulations of the distortionless transmission lines with different number of leakage resistors are shown in TABLE I. The jitters of output voltages and the usage of the poly area are listed for different number of leakage resistors used in the transmission line. When the number of stages increases from 4 to 160, the jitter reduces from 27 ps to 2.08 ps. In the meanwhile, the poly area usage increases from 0.52 μm² to 832 μm².

Figure 10:
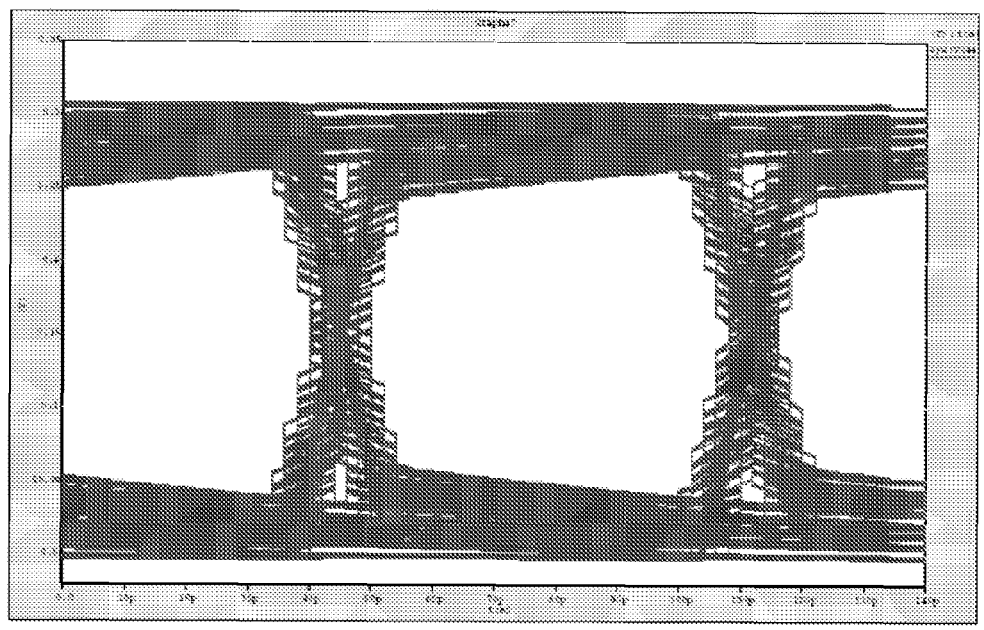
FIGS. 10 and 11 show eye diagrams of the distortionless differential transmission line in FIG. 9 with two different numbers of leakage resistors.
Figure 11:
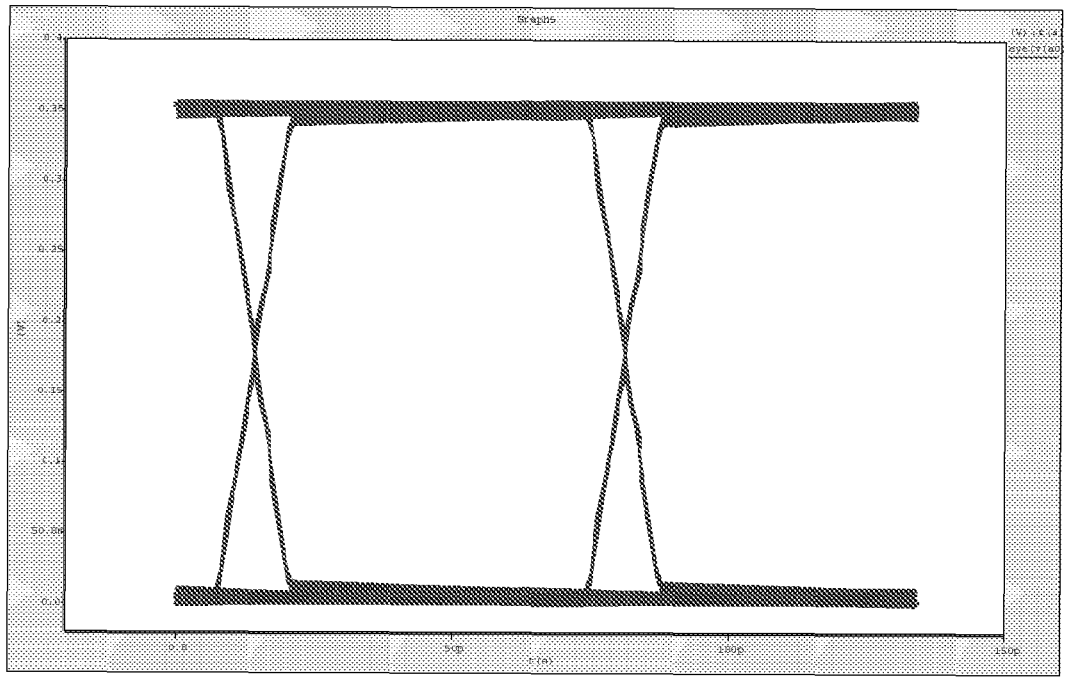

FIGS. 10 and 11 show the eye diagrams of the output signals for distortionless transmission line with 4 stages and 120 stages of leakage resistors, respectively. FIG. 10 shows an eye diagram indicating signal quality for the output signal of a distortionless transmission line having four stages of leak resistors. When the there are only 4 resistors inserted into the distortionless line, the signal quality degrades as shown in FIG. 10. FIG. 11 shows an eye diagram indicating signal quality for the output signal of a distortionless transmission line having 120 stages of leak resistors. When the number of shunt resistors increases to 120, the transmission line achieves almost distortionless transportation, the data dependent jitter is only 2.1 ps.

The above and other implementations of distortionless differential transmission lines may be used to interconnect various electronic elements, device, and modules. The data communication busses between CPUs, digital signal processors, memory banks, and others, are a few examples of the applications.

Figure 12A:
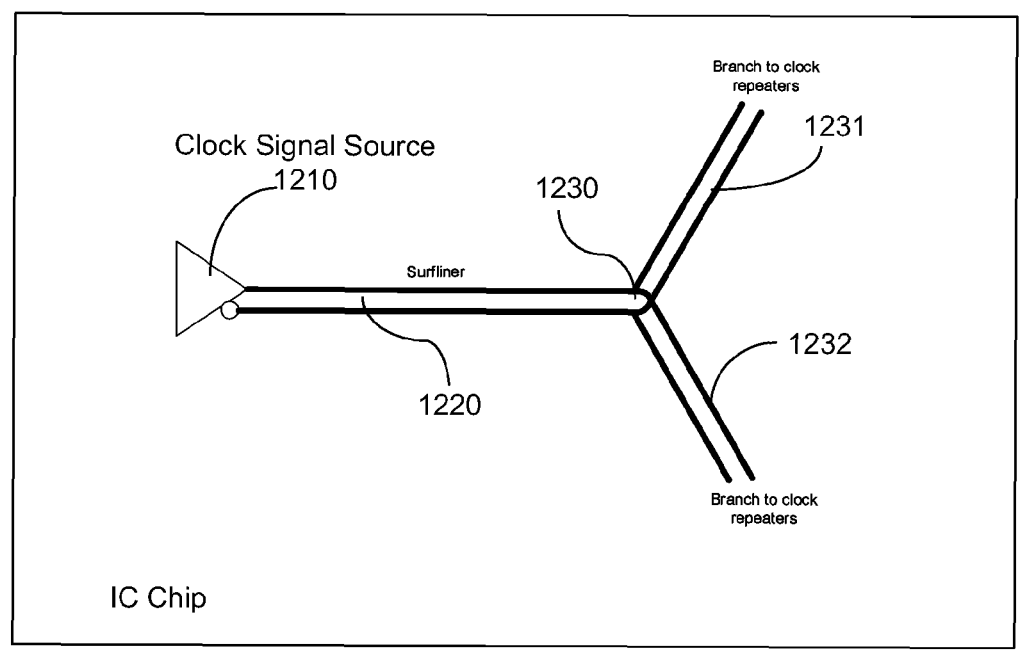
FIGS. 12A-12D show example circuit including distortionless differential transmission lines.
Figure 12B:
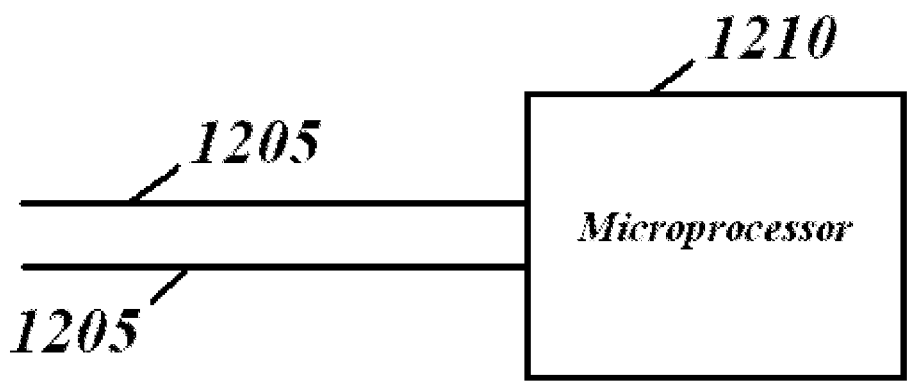
Figure 12C:
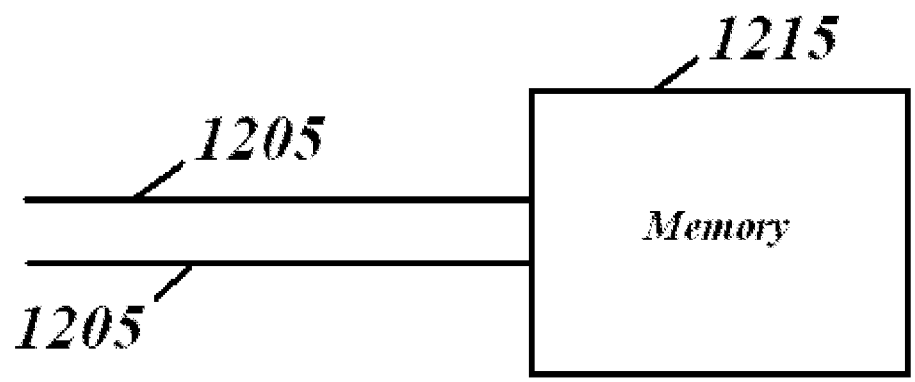
Figure 12D:
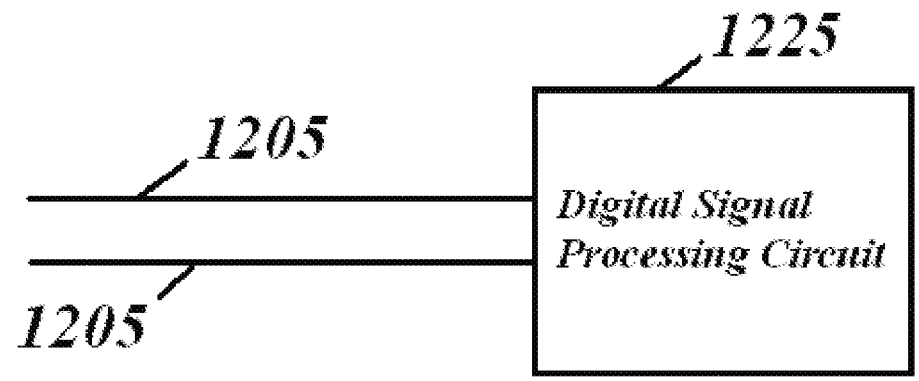

FIGS. 12A-12D show example circuits including distortionless differential transmission lines. FIG. 12A shows one example of a clock distribution circuit on an IC chip using distortionless differential transmission lines. A clock signal source 1210 supplies the clock signal to be distributed to two or more locations on the chip. A distortionless differential transmission line 1220 (surfliner) is connected to the source 1210 to receive and deliver the clock signal to an interconnect junction 1230. At the junction 1230, the transmission line 1230 is split into or connected to two other distortionless transmission lines 1231 and 1232. As such, the clock signal is split into a first clock signal to the transmission line 1231 to the first destination (e.g., a branch to one or more clock repeaters) and a second clock signal to the transmission line 1232 to the second destination (e.g., a branch to one or more clock repeaters). Certainly, various other applications for the distortionless transmission lines are possible. For instance, FIGS. 12B-12D show distortionless differential transmission lines 1205 connected to a microprocessor 1210, a memory circuit 1215, and a digital signal processing circuit 1225, respectively.

What is claimed is:

1. A device, comprising:
  a first conductor and a second conductor configured to form a differential transmission line to transmit an electrical signal; and
  a plurality of leakage resistors connected between the first and second conductors at different positions along the differential transmission line to make a phase velocity and a signal attenuation of the electrical signal to be independent of a frequency of the electrical signal;
  wherein the device further includes a signal driver coupled to one end of the differential transmission line to generate the electrical signal and a signal receiver coupled to another end of the differential transmission line to receive the electrical signal, and the plurality of leakage resistors are connected to the differential transmission line between the signal driver and the signal receiver,
  wherein the plurality of leakage resistors are equal in resistance,
  wherein each leakage resistor has a conductance per one unit length of RC/L, where R, C and L are effective resistance, capacitance and inductance of the differential transmission line per one unit length, respectively,
  wherein the plurality of leakage resistors are equally spaced from one another along the differential transmission line, and
  wherein a spacing between two adjacent leakage resistors is equal to or less than $ct_p/20$, wherein $t_p$ is a clock period of the electrical signal and c is a speed of light in a dielectric material surrounding the transmission line.

2. A device as in claim 1, wherein each leakage resistor is a poly resistor.

3. A device as in claim 1, wherein each leakage resistor is a diffusion resistor.

4. A device as in claim 1, further comprising a digital signal processing circuit connected to one end of the differential transmission line.

5. A device as in claim 1, further comprising a microprocessor connected to one end of the differential transmission line.

6. A device as in claim 1, further comprising a memory circuit connected to one end of the differential transmission line.

7. A device as in claim 1, further comprising:
  a substrate on which the first and second conductors and the leakage resistors are formed,
  wherein the substrate includes a first conductor layer comprising a power/ground conductor on the substrate.

8. A device as in claim 7, further comprising a second conductor layer comprising a power/ground conductor on the substrate, wherein the second conductor is a conductor line located between the first conductor layer and the second conductor layer.

9. A device as in claim 1, wherein each leakage resistor is a resistive metal resistor.

10. A device as in claim 1, further comprising a clock signal generator connected to one end of the differential transmission line.

11. A device, comprising:
  a first conductor and a second conductor configured to form a differential transmission line to transmit an electrical signal;
  a plurality of leakage resistors connected between the first and second conductors at different positions along the differential transmission line to make a phase velocity and a signal attenuation of the electrical signal to be independent of a frequency of the electrical signal,
  wherein the device further includes a signal driver coupled to one end of the differential transmission line to generate the electrical signal and a signal receiver coupled to another end of the differential transmission line to receive the electrical signal, and the plurality of leakage resistors are connected to the differential transmission line between the signal driver and the signal receiver;
  third and fourth conductors between which the differential transmission line is located; and
  further comprising a second differential transmission line in parallel to the differential transmission line and comprising fifth and sixth conductors in parallel to the first and second conductors,
  wherein the fifth conductor is positioned on one side of the second conductor opposite to the first conductor and the sixth conductor is positioned on one side of the fifth conductor opposite the second conductor, and
  wherein the first and fifth conductors are at a common electrical potential with respect to each other at each position along the first and second differential transmission lines and the second and six conductors are at a common electrical potential with respect to each other at each position along the first and second differential transmission lines.

12. A device, comprising:
  a first conductor and a second conductor configured as a differential transmission line to transmit an electrical signal; and
  a plurality of leakage resistors connected between the first and second conductors at different positions along the differential transmission line, wherein each leakage resistor has a conductance per one unit length of RC/L, where R, C and L are effective resistance, capacitance and inductance of the differential transmission line per one unit length, respectively;
  wherein a spacing between two adjacent leakage resistors is equal to or less than $ct_p/20$, wherein $t_p$ is a clock period of the electrical signal and c is a speed of light in a dielectric material surrounding the transmission line.

13. A device as in claim 12, wherein one or more of the plurality of leakage resistors is a diffusion resistor.

14. A device as in claim 12, further comprising a clock signal generator connected to one end of the differential transmission line.

15. A device as in claim 12, wherein one or more of the plurality of leakage resistors is a poly resistor.

16. A method, comprising:
  using at least two conductors to form a differential transmission line to transmit an electrical signal; and
  connecting a plurality of leakage resistors between the at least two conductors at different locations along the differential transmission line, to make the phase velocity and attenuation of the signal in the transmission line independent of a frequency of the signal;
  wherein each leakage resistor has a conductance per one unit length of RC/L, where R, C and L are effective resistance, capacitance and inductance of the differential transmission line per one unit length, respectively; and
  wherein a spacing between two adjacent leakage resistors is equal to or less than $ct_p/20$, wherein $t_p$ is a clock period of the electrical signal and c is a speed of light in a dielectric material surrounding the transmission line.

17. The method of claim 16, further comprising connecting a clock signal generator to one end of the differential transmission line.

18. The method of claim 16, further comprising using a poly resistor for at least one of the plurality of leakage resistors.

19. The method of claim 16, further comprising using a diffusion resistor for at least one of the plurality of leakage resistors.

* * * * *